(12) United States Patent
Kimura

(10) Patent No.: US 8,994,160 B2
(45) Date of Patent: Mar. 31, 2015

(54) RESIN-ENCAPSULATED SEMICONDUCTOR DEVICE AND METHOD OF MANUFACTURING THE SAME

(71) Applicant: Seiko Instruments Inc., Chiba (JP)

(72) Inventor: Noriyuki Kimura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 14/030,100

(22) Filed: Sep. 18, 2013

(65) Prior Publication Data

US 2014/0084435 A1    Mar. 27, 2014

(30) Foreign Application Priority Data

Sep. 24, 2012   (JP) .................................. 2012-209887

(51) Int. Cl.
*H01L 23/00*      (2006.01)
*H01L 23/495*     (2006.01)
*H01L 21/56*      (2006.01)
*H01L 23/31*      (2006.01)

(52) U.S. Cl.
CPC ................ *H01L 24/33* (2013.01); *H01L 24/94* (2013.01); *H01L 23/495* (2013.01); *H01L 24/97* (2013.01); *H01L 23/49541* (2013.01); *H01L 23/49548* (2013.01); *H01L 21/561* (2013.01); *H01L 21/568* (2013.01); *H01L 2224/48247* (2013.01); *H01L 2224/97* (2013.01); *H01L 2224/85005* (2013.01); *H01L 23/3107* (2013.01)
USPC .................. 257/676; 257/666; 257/E23.031; 438/108; 438/122; 438/612

(58) Field of Classification Search
CPC ........... H01L 2224/48247; H01L 2224/49171; H01L 2924/014; H01L 23/4952
USPC ........... 257/666, E23.031; 438/108, 122, 612
See application file for complete search history.

(56) References Cited

U.S. PATENT DOCUMENTS

| | | | | |
|---|---|---|---|---|
| 6,143,981 | A  * | 11/2000 | Glenn ........................... | 174/534 |
| 7,183,630 | B1 * | 2/2007  | Fogelson et al. .............. | 257/666 |
| 7,691,681 | B2 * | 4/2010  | Lee ................................ | 438/123 |
| 7,880,313 | B2 * | 2/2011  | Lee et al. ....................... | 257/778 |
| 8,067,823 | B2 * | 11/2011 | Lee ................................ | 257/673 |
| 8,232,144 | B2 * | 7/2012  | Lange et al. ................... | 438/123 |
| 8,405,230 | B2 * | 3/2013  | Lee et al. ....................... | 257/778 |
| 2006/0192294 | A1 * | 8/2006 | Lee ................................ | 257/778 |
| 2006/0192295 | A1 * | 8/2006 | Lee et al. ....................... | 257/778 |
| 2008/0102563 | A1 * | 5/2008 | Lange et al. ................... | 438/113 |
| 2008/0299705 | A1 * | 12/2008 | Lee .............................. | 438/108 |
| 2011/0108970 | A1 * | 5/2011 | Lee et al. ....................... | 257/676 |
| 2011/0290863 | A1 * | 12/2011 | Kajiwara et al. .............. | 228/227 |

* cited by examiner

*Primary Examiner* — Chuong A Luu
*Assistant Examiner* — Jaehwan Oh
(74) *Attorney, Agent, or Firm* — Adams & Wilks

(57) ABSTRACT

A resin-encapsulated semiconductor device includes: a semiconductor element mounted on a die pad portion; a plurality of lead portions disposed so that distal end parts thereof are opposed to the die pad portion; a metal thin wire for connecting an electrode of the semiconductor element to the lead portion; and an encapsulating resin for partially encapsulating those components. A bottom surface part of the die pad portion, and a bottom surface part, an outer surface part, and an upper end part of the lead portion are exposed from the encapsulating resin. A plated layer is formed on the exposed lead bottom surface part and the exposed lead upper end part.

6 Claims, 10 Drawing Sheets

One unit

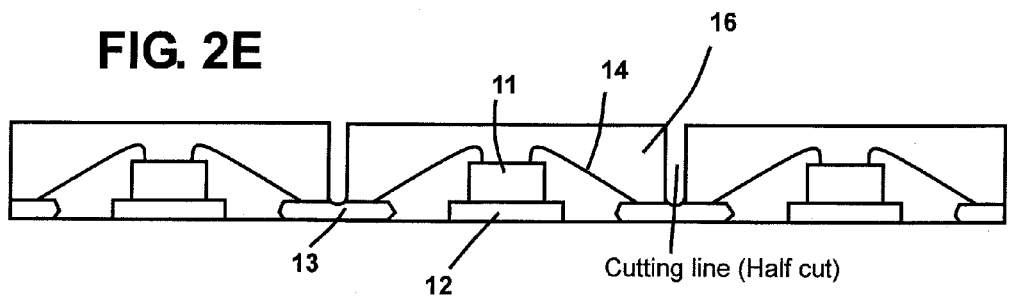
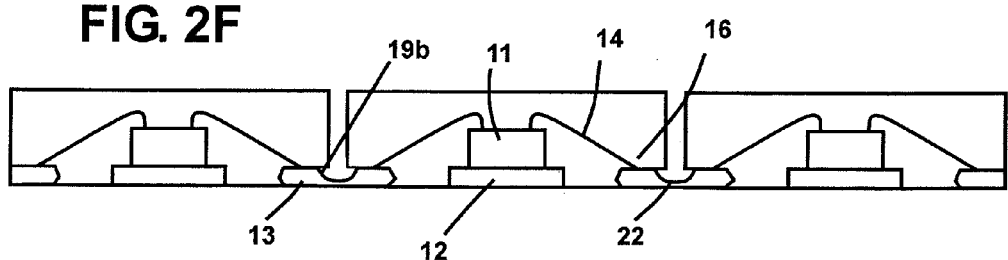

RESIN-ENCAPSULATED SEMICONDUCTOR DEVICE AND METHOD OF MANUFACTURING THE SAME

BACKGROUND OF THE INVENTION

1. Field of the Invention

The present invention relates to a resin-encapsulated semiconductor device of a non-lead type called QFN or DFN, and a method of manufacturing the same, and more particularly, to an improvement of mounting reliability at a lead terminal portion.

2. Description of the Related Art

In recent years, demands have been made for high-density mounting of semiconductor components in order to respond to the reduction in size of electronic devices. Along with the demands, the semiconductor components have been more and more downsized and thinned. In addition to BGA and CSP packages, DFN and QFN semiconductor devices have been put into practical use as compact packages using a lead frame.

FIG. 6A is a rear view of a conventional DFN package. FIG. 6B is a cross-sectional view taken along the line A-A of FIG. 6A. In the DFN package, lead portions 13 and a semiconductor element mounted on a die pad portion 12 are encapsulated by an encapsulating resin 16, and the plurality of lead portions 13 and the die pad portion 12 are exposed from a rear surface of the package. The plurality of lead portions 13 is arranged on the rear surface of the package along two parallel lines to form external leads. The plurality of lead portions 13 is electrically connected to the electrodes on the surface of the semiconductor element 11 with metal thin wires 14 in the encapsulating resin 16.

The DFN package has an advantage that a mounting substrate can be reduced in mounting area because the plurality of lead portions 13 do not protrude outward from the encapsulating resin 16. Another advantage is that, by exposing the die pad portion 12 from the encapsulating resin 16, heat generated inside can be radiated efficiently to the outside. Note that, some DFN packages have another structure in which the die pad portion 12 is encapsulated in the encapsulating resin 16. A QFN package has a structure in which external leads are exposed from a rear surface of the package in four directions.

FIG. 7 is a top view of a frame after resin-encapsulation as seen from above. FIG. 8 is a cross-sectional view taken along the line B-B after cutting of the frame of FIG. 7. The following method has hitherto been employed (see, for example, Japanese Patent Translation Publication No. 2002-519848 (FIG. 7)). That is, as illustrated in FIGS. 7 and 8, the semiconductor elements 11 mounted on the respective die pad portions 12 of the frame are encapsulated with the encapsulating resin 16, and then the encapsulating resin 16 and the lead portions 13 are simultaneously cut along cutting lines by a rotary blade of a dicing device, thereby singularized into individual semiconductor devices as illustrated in FIG. 9.

In this type of resin-encapsulated semiconductor device, the individual semiconductor devices are obtained by cutting the cutting regions of the lead portions 13 with the rotary blade to separate from the frame after the resin-encapsulation. No plated layer 17 is, however, present on an end surface of the cut part of the lead portion 13, because the lead portions 13 are formed by cutting from the frame. Thus, when the semiconductor device is bonded onto a mounting substrate 20 such as a printed substrate with the use of solder 18, a solder fillet of the solder 18 is not formed on a side surface part of the lead portion 13 exposed from the resin-encapsulated part, with the result that the mounting strength may be reduced to lower the mounting reliability.

A description is given with reference to the drawings. FIG. 10 illustrates the lead portion 13 of the semiconductor device as an enlarged view of the circle illustrated in FIG. 9. On an end surface part of the lead portion 13 that is exposed from the encapsulating resin 16 by lead cutting, the plated layer 17 is not present, which is formed instead on another external surface of the lead portion 13. Thus, as illustrated in FIG. 11 as a schematic cross-sectional view enlarging the mounted state, when the semiconductor device is mounted onto the mounting substrate 20 by an adhesive such as the solder 18, the solder fillet is not formed at the end surface part of the lead portion 13, and hence the mounting strength is lowered.

SUMMARY OF THE INVENTION

The present invention provides a semiconductor device and a method of manufacturing the same, which are capable of improving the strength and enhancing the mounting reliability in substrate mounting of a DFN or QFN resin-encapsulated semiconductor device.

The following measures are used.

First, a resin-encapsulated semiconductor device according to one embodiment of the present invention includes: a semiconductor element mounted on a die pad portion; a plurality of lead portions disposed so that distal end parts thereof are opposed to the die pad portion; a metal thin wire for connecting an electrode of the semiconductor element to a corresponding one of the plurality of lead portions; and an encapsulating resin for partially encapsulating the die pad portion, the semiconductor element, and the plurality of lead portions. A bottom surface part of the die pad portion, and a bottom surface part, an outer surface part, and an upper end part of each of the plurality of lead portions are exposed from the encapsulating resin. The exposed lead bottom surface part and the exposed lead upper end part each have a plated layer.

Further, in the resin-encapsulated semiconductor device, the lead upper end part including the plated layer is formed to have an arc shape.

Further, in the resin-encapsulated semiconductor device, the plated layer of the lead bottom surface part and the plated layer of the lead upper end part are formed of one of a single metal layer and an alloy layer of at least two metal layers selected from the group consisting of lead, bismuth, tin, copper, silver, palladium, and gold.

Further, in the resin-encapsulated semiconductor device, a gap portion is provided between the lead upper end part having the plated layer and the encapsulating resin.

Further, a method of manufacturing a resin-encapsulated semiconductor device according to one embodiment of the present invention includes: preparing one of a frame and an electroformed substrate, including a plurality of units each including a die pad portion and a plurality of lead portions disposed so that distal end parts thereof are opposed to the die pad portion; mounting a semiconductor element on each of the die pad portions of the one of the frame and the electroformed substrate, and electrically connecting the plurality of lead portions and electrodes on a surface of the semiconductor element to each other with a metal thin wire; in encapsulating the die pad portions, the semiconductor elements, and the plurality of lead portions with an encapsulating resin, exposing a bottom surface part of the die pad portion and a bottom surface part of each of the plurality of lead portions; performing lead pre-cutting by cutting a cutting region of each of the plurality of lead portions by a rotary blade from an upper surface side of the encapsulating resin, the cutting region corresponding to a boundary between the plurality of units of the one of the frame and the electroformed substrate after the resin-encapsulation, thereby forming a concave part at the cutting region while leaving a part of the each of the plurality of lead portions uncut; subjecting a surface of the concave part to wet etching to form a lead upper end part; immersing the one of the frame and the electroformed substrate after the wet etching into a plating bath to form a plated layer on the lead bottom surface part and the lead upper end part; and performing lead full-cutting by cutting the concave part at the cutting region by one of a rotary blade and a cutting punch so as to cut the remaining lead portion at the concave part, thereby separating the resin-encapsulated semiconductor device from the frame.

The above-mentioned measures enables the formation of a solder fillet up to the plated layer of the lead upper end part provided on the lead portion when the resin-encapsulated semiconductor device of the present invention is bonded by solder onto a land portion of a mounting substrate such as a printed substrate, improving the mounting strength to enhance the mounting reliability. Besides, in substrate mounting, because the solder fillet having an excellent shape is formed on a lead end surface part, the recognition accuracy in a visual test of the bonded part after the mounting can be improved to decrease a recognition failure.

BRIEF DESCRIPTION OF THE DRAWINGS

In the accompanying drawings:

FIGS. 2E to 2H are cross-sectional views following FIGS. 2B to 2D, illustrating the method of manufacturing a resin-encapsulated semiconductor device according to one embodiment of the present invention;

DETAILED DESCRIPTION OF THE PREFERRED EMBODIMENT

A resin-encapsulated semiconductor device and a method of manufacturing the same according to one embodiment of the present invention are described below with reference to the accompanying drawings. First, a description is given to a frame according to the embodiment.

Figure 1:
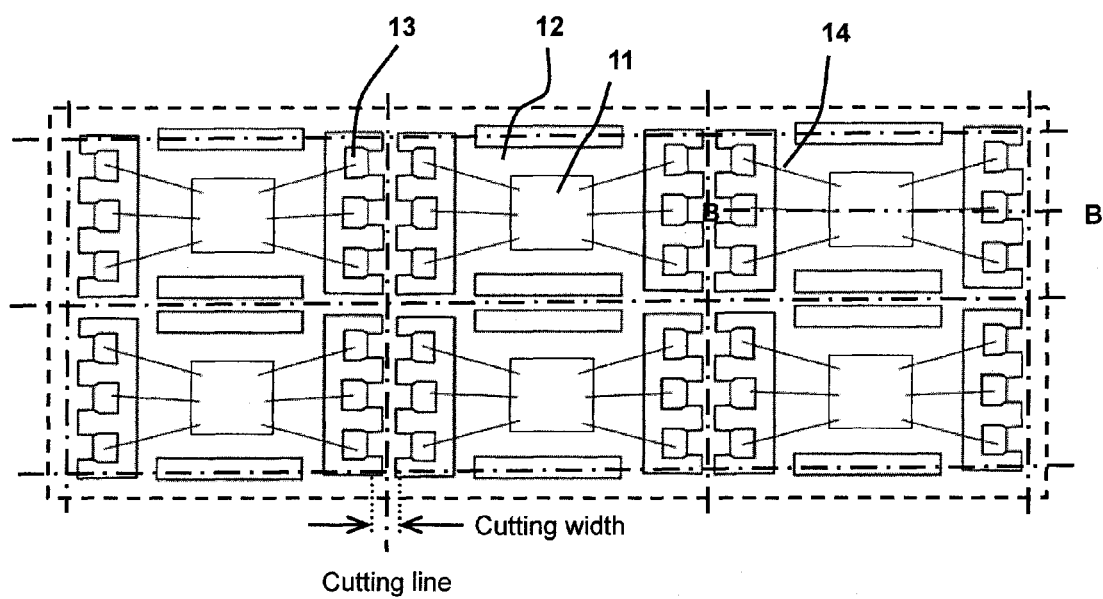
FIG. 1 is a top view of a frame on which semiconductor elements are mounted according to one embodiment of the present invention.
Figure 2A:
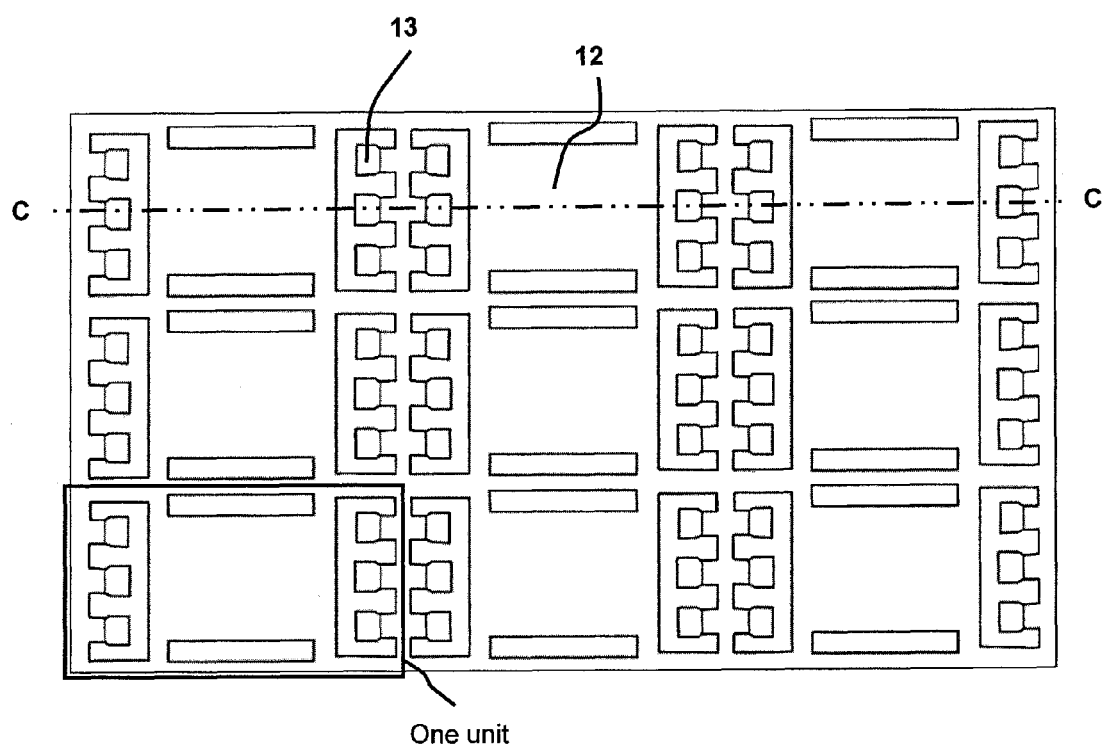
FIG. 2A and FIGS. 2B to 2D are a top view and cross-sectional views, respectively, illustrating a method of manufacturing a resin-encapsulated semiconductor device according to one embodiment of the present invention.

FIG. 1 is a top view of the frame on which semiconductor elements are mounted according to this embodiment. FIG. 2A is a top view of the frame before the semiconductor elements are mounted. FIGS. 2B to 2H are cross-sectional views illustrating a method of manufacturing a semiconductor device. As illustrated in FIG. 1, the semiconductor device according to the embodiment has the frame made of a copper (Cu) material, and includes a plurality of units each including a semiconductor element 11 that is mounted on a die pad portion 12 and a plurality of lead portions 13 that are disposed so that distal end parts thereof are opposed to the die pad portion 12. In FIG. 1, the broken line indicates a region to be encapsulated with an encapsulating resin 16 when the semiconductor elements 11 are mounted to constitute a resin-encapsulated semiconductor device, and the dashed line indicates a cutting line for separating the resin-encapsulated semiconductor device into individual semiconductor devices after the semiconductor elements 11 are mounted and encapsulated with the resin to constitute the resin-encapsulated semiconductor device.

Figure 3:
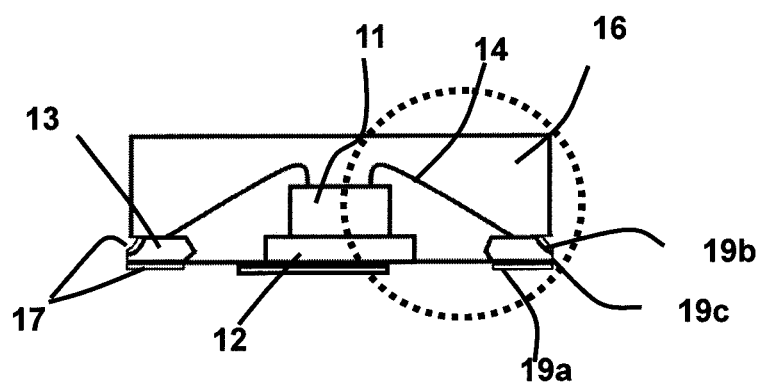
FIG. 3 is a cross-sectional view illustrating a resin-encapsulated semiconductor device according to one embodiment of the present invention.

Next, a description is given to the resin-encapsulated semiconductor device according to the embodiment. FIG. 3 is a view illustrating the resin-encapsulated semiconductor device using the frame illustrated in FIG. 1, and is a cross-sectional view taken along the line B-B illustrated in FIG. 1.

As illustrated in FIG. 3, the semiconductor element 11 is mounted on the die pad portion 12 of the frame, and an electrode on the semiconductor element 11 is electrically connected to the lead portion 13 with a metal thin wire 14. The outer peripheries of the semiconductor element 11 on the die pad portion 12 and the lead portion 13 are encapsulated with the encapsulating resin 16. The lead portion 13 is exposed from a bottom surface of the encapsulating resin 16, and a lead bottom surface part 19a constitutes an external terminal. In DFN or QFN, the lead bottom surface part and the bottom surface of the encapsulating resin are substantially flush with each other. A lead outer surface part 19c corresponding to a distal end of the lead is exposed from a side surface of the encapsulating resin 16. Depending on the manner of cutting, the lead outer surface part 19c may be substantially flush with the side surface of the encapsulating resin 16, or may protrude slightly from the side surface of the encapsulating resin 16. In the resin-encapsulated semiconductor device according to this embodiment, a lead upper end part 19b is further provided on the lead outer surface part 19c so as to be continuous from the lead outer surface part 19c. Because the lead upper end part 19b is formed to have an arc shape in cross section, a gap portion without the encapsulating resin 16 is provided between the lead upper end part 19b and the encapsulating resin 16. Thus, the lead portion 13 is shaped to be thinner as being closer to the lead outer surface part 19c corresponding to the distal end of the lead portion 13, and hence the encapsulating resin is present above the lead upper end part in the vertical direction via the gap portion. Note that, when seen from the encapsulating resin side, the gap portion is a region located below the encapsulating resin in the vertical direction, in which no metal of the lead portion is present between the encapsulating resin and the lead upper end part.

The lead bottom surface part 19a and the lead upper end part 19b each have a plated layer 17, and the plated layer 17 is formed of a metal or an alloy of a plurality of metals selected from the group consisting of lead, bismuth, tin, copper, silver, palladium, and gold by electroplating or electroless plating.

Figure 4:
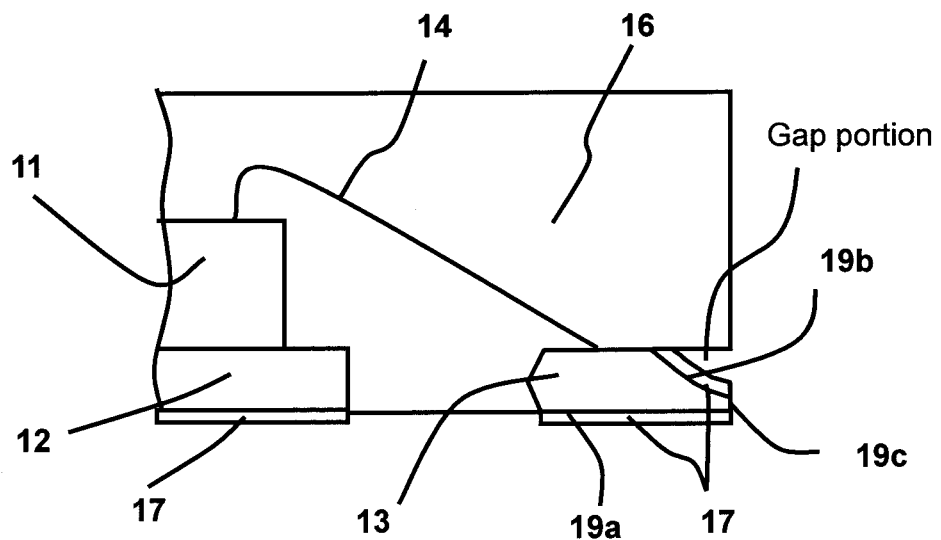
FIG. 4 is a cross-sectional view illustrating the resin-encapsulated semiconductor device according to one embodiment of the present invention (an enlarged view of a lead portion)

FIG. 4 is an enlarged view enlarging (in an encircled part) the lead portion 13 illustrated in FIG. 3, and illustrates the lead portion 13, the lead bottom surface part 19a, the lead upper end part 19b, the lead outer surface part 19c, and the plated layer 17.

Figure 5:
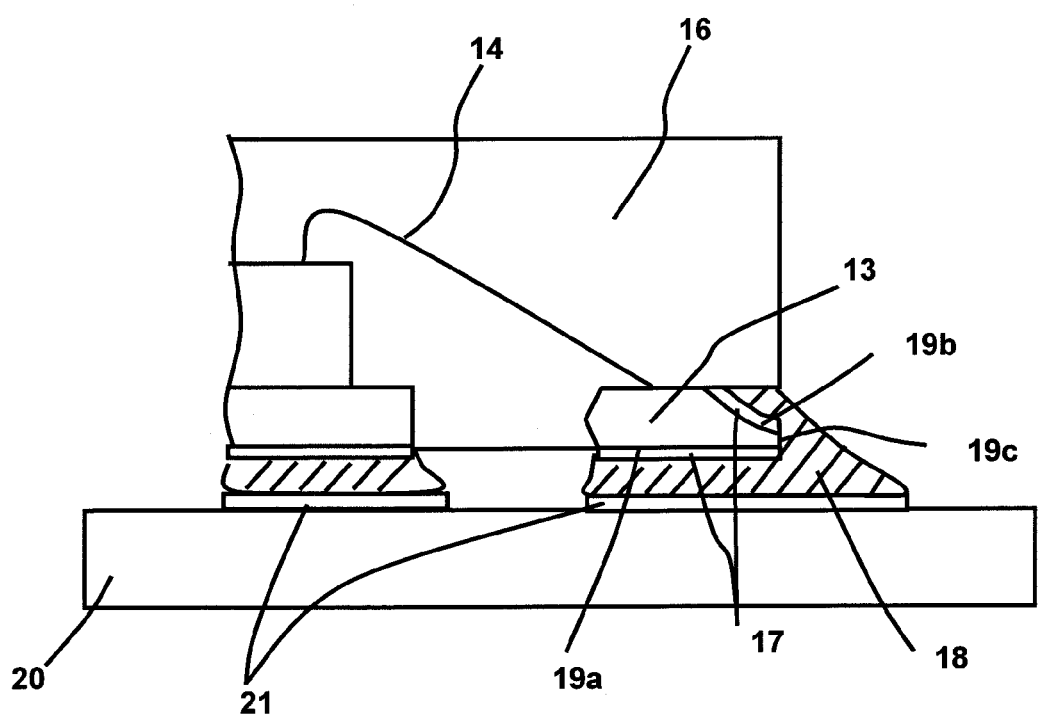
FIG. 5 is a cross-sectional view illustrating the resin-encapsulated semiconductor device according to one embodiment of the present invention (an enlarged view of a mounted state)
Figure 6A:
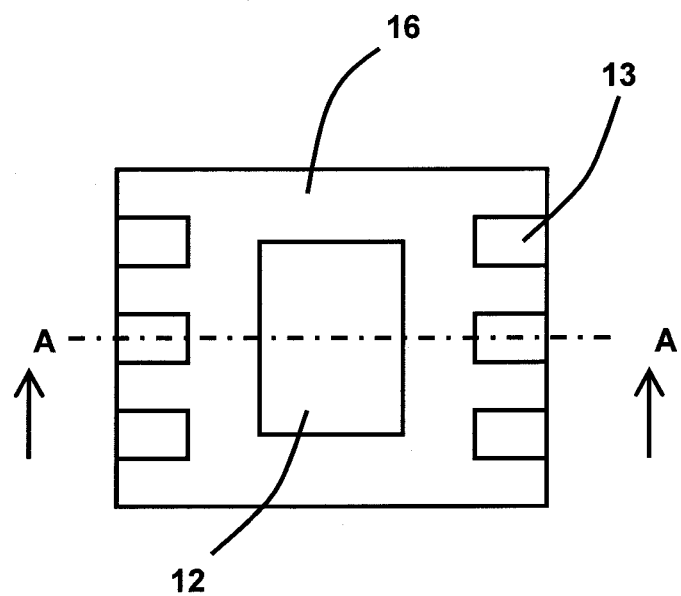
FIGS. 6A and 6B are views illustrating a conventional resin-encapsulated semiconductor device.
Figure 6B:
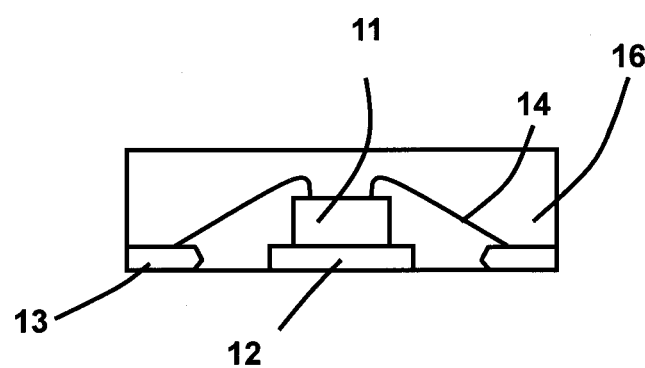
Figure 7:
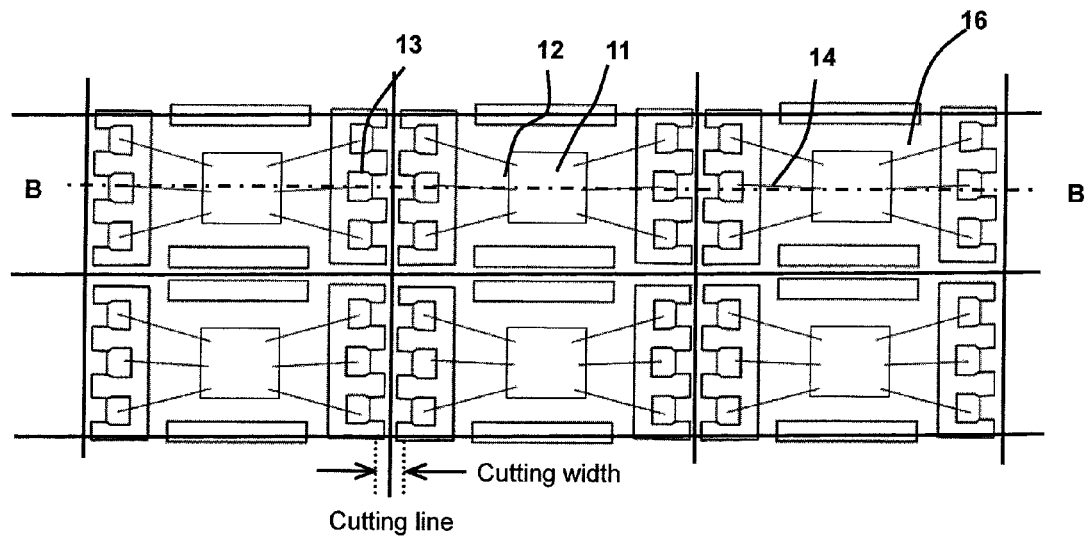
FIG. 7 is a top view of a frame illustrating a conventional method of manufacturing a resin-encapsulated semiconductor device.
Figure 8:
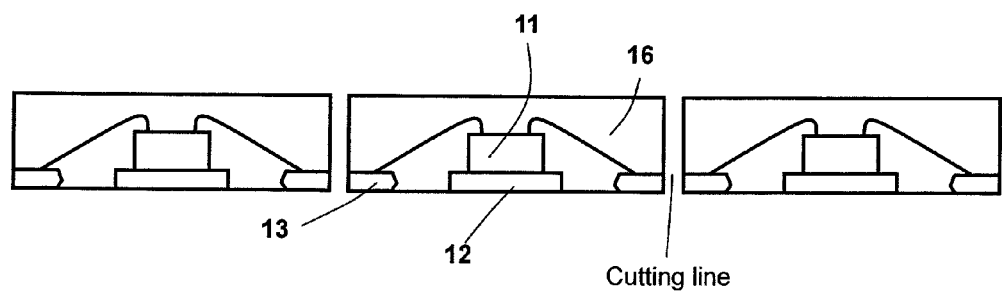
FIG. 8 is a cross-sectional view illustrating the conventional method of manufacturing a resin-encapsulated semiconductor device.
Figure 9:
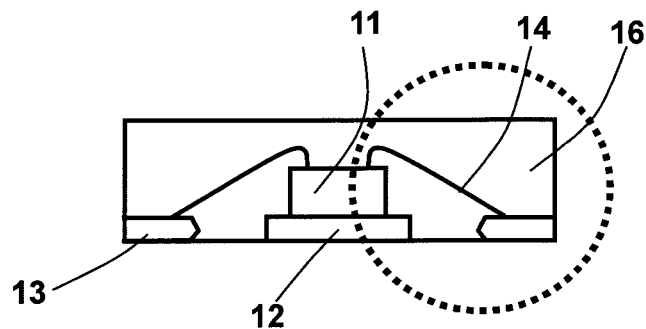
FIG. 9 is a cross-sectional view of the conventional resin-encapsulated semiconductor device.
Figure 10:
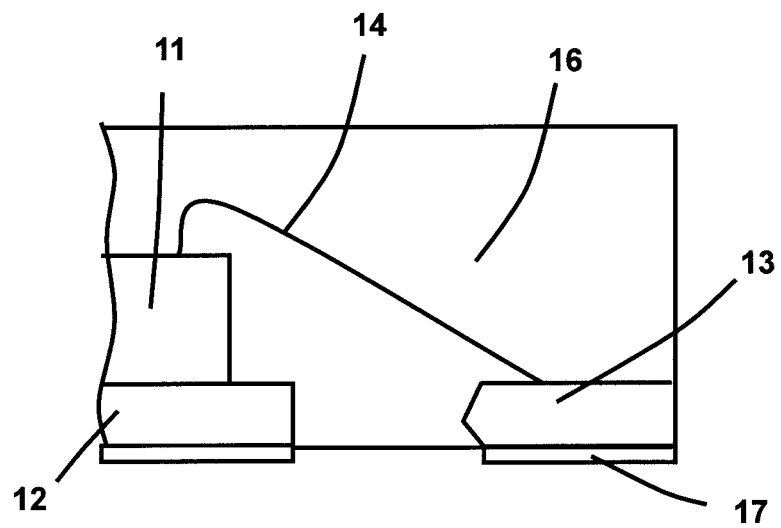
FIG. 10 is a cross-sectional view illustrating the conventional resin-encapsulated semiconductor device (an enlarged view of a lead portion)
Figure 11:
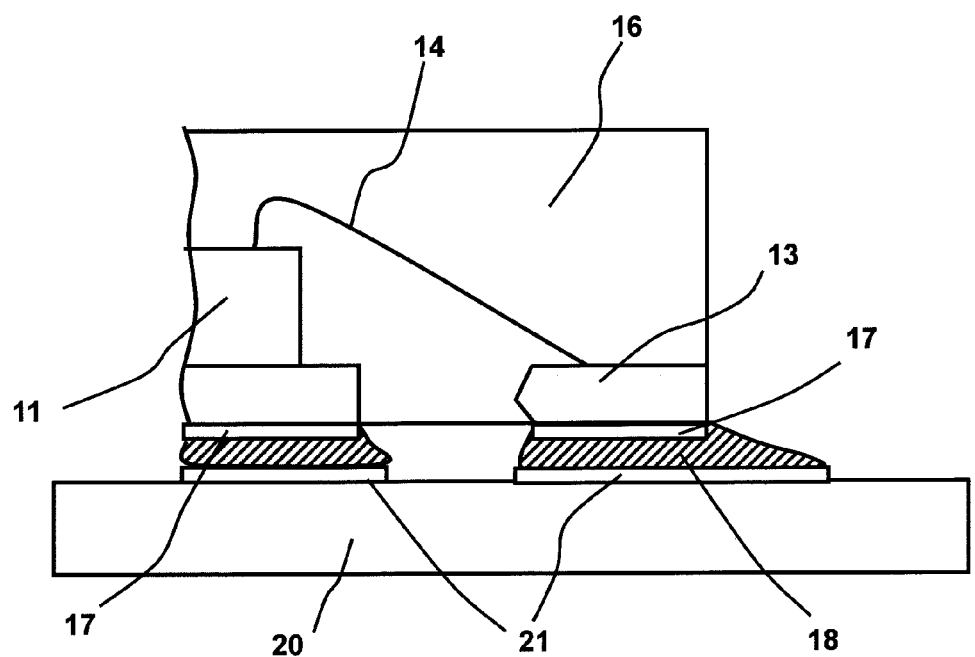
FIG. 11 is a cross-sectional view illustrating the conventional resin-encapsulated semiconductor device (an enlarged view of a mounted state).

As illustrated in FIG. 5, when the resin-encapsulated semiconductor device according to this embodiment is bonded by solder 18 onto a land portion 21 of a mounting substrate 20 such as a printed substrate, a solder fillet is formed on a side surface part of the lead portion 13 because the lead upper end part 19b provided on the lead portion 13 has the plated layer 17. Thus, the mounting strength can be improved to enhance the mounting reliability.

Next, a description is given of a method of manufacturing a resin-encapsulated semiconductor device according to this embodiment.

As illustrated in FIG. 2A, a lead frame made of a copper material is prepared, which includes a plurality of units each including in a frame a rectangular die pad portion 12 for mounting a semiconductor element thereon and a plurality of lead portions 13 disposed so that distal end parts thereof are opposed to the die pad portion 12. A sealing sheet 15 is bonded on the bottom surface side of the lead frame. The sealing sheet 15 is a functional member for protecting the lead portion 13 so that the encapsulating resin may not flow around to the bottom surface of the lead portion 13 and exposing the bottom surface of the lead portion 13.

Figure 2B:
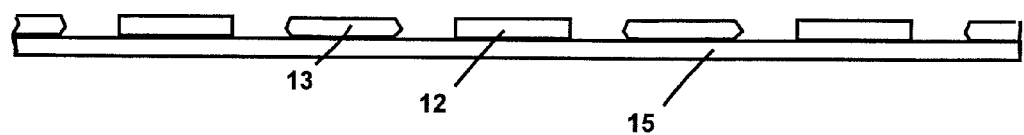
Figure 2C:
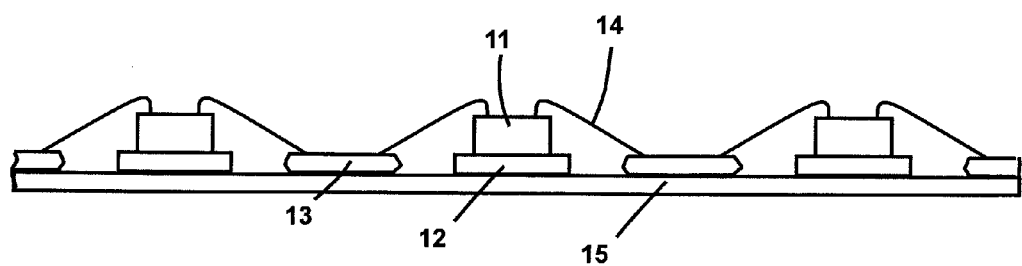

As illustrated in FIG. 2B, the semiconductor elements 11 are die-bonded onto the die pad portions 12 of the respective units of the lead frame by an adhesive (not shown) such as silver paste. After that, as illustrated in FIG. 2C, an electrode pad (not shown) on the semiconductor element 11 is electrically connected to the lead portion 13 by a metal thin wire 14 by wire bonding.

Figure 2D:
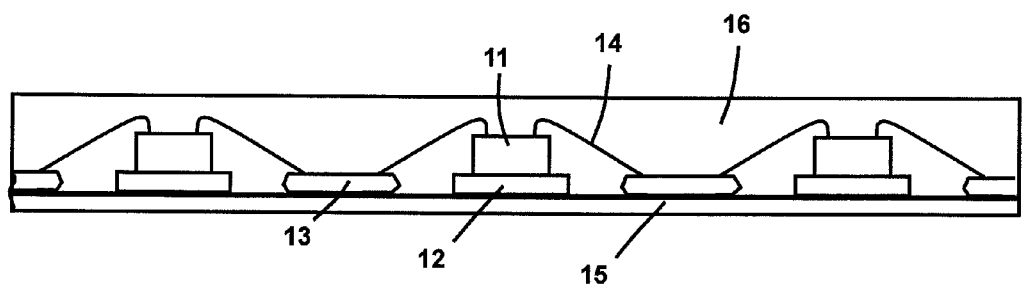

Next, as illustrated in FIG. 2D, by transfer molding, the outer periphery of the lead frame, that is, upper surface regions of the die pad portion 12, the semiconductor element 11, and the lead portion 13 and a connection region of the metal thin wire 14 are encapsulated with an encapsulating resin 16 made of an epoxy-based resin.

Next, as illustrated in FIG. 2E, the sealing sheet 15 adhered onto the bottom surfaces of the lead portions 13 of the lead frame are removed. In this state, the die pad portion 12 and the lead portion 13 are exposed from the encapsulating resin 16. Lead pre-cutting is performed as first cutting in a manner that the cutting region of the lead portion 13 of the lead frame after the resin-encapsulation is cut by a rotary blade from the encapsulating resin 16 side by dicing, thereby forming a concave portion at the cutting region. In the lead pre-cutting, the thickness of the lead portion 13 is cut by 5% to 80%.

Next, as illustrated in FIG. 2F, the uncut remaining lead portion is subjected to isotropic wet etching from the surface side of the encapsulating resin 16 so as to have an arc shape, resulting in a formation of a lead upper end part 19b as a part of a wet-etched portion 22.

Next, as illustrated in FIG. 2G, a plated layer 17 is formed on a bottom surface part 19a and the upper end part 19b of the lead portion 13 formed into the arc shape by wet etching of the lead portion 13 of the lead frame and at a bottom surface part of the die pad portion 12. In this case, the plated layer containing 100% of tin in its composition is formed by electroplating. The plated layer 17 may be formed by electroless plating instead of the electroplating.

In the above description, the sealing sheet 15 is removed in the process of FIG. 2E. Alternatively the sealing sheet 15 may be removed after the wet etching of FIG. 2F, that is, before the formation of the plated layer 17.

Next, as illustrated in FIG. 2H, the concave parts at the cutting regions of the lead portions 13 having the plated layers 17 formed thereon are full-cut from the encapsulating resin 16 side by a rotary blade as second lead cutting, to thereby separate the resin-encapsulated semiconductor devices from the lead frame. At this time, a lead outer surface part 19c is formed. In this step, the remaining lead portion 13 is so thin to be cut by the blade without any resistance. In this embodiment, the rotary blade is used for the full-cutting as the second lead cutting so as to separate the resin-encapsulated semiconductor devices from the lead frame. Alternatively another cutting method using a punch die may be used for the separation. In this case, the occurrence of burrs (flashes) from a lead material of the lead frame can be prevented.

Note that, the width and shape of the rotary blade used for the lead pre-cutting and the lead full-cutting may be changed as appropriate. For example, the width of the rotary blade used for the lead full-cutting may be set to be smaller than the width of the rotary blade used for the lead pre-cutting. In this case, the lead outer surface part 19c corresponding to the distal end of the lead portion 13 protrudes slightly outward from the side surface of the encapsulating resin 16.

As described above, in the resin-encapsulated semiconductor device and the method of manufacturing the same according to the present invention, a solder fillet is formed on the side surface part of the lead portion 13 in the process of bonding the semiconductor device onto the land portion 21 of the mounting substrate 20 such as a printed substrate by the solder 18 because the lead upper end part 19b provided on the lead portion 13 has the plated layer 17. Thus, the mounting strength can be improved to enhance the mounting reliability. Besides, in the substrate mounting, because the solder fillet having an excellent shape is formed on the lead end surface part, the recognition accuracy in a visual test of the bonded part after the mounting can be improved to decrease a recognition failure.

What is claimed is:

1. A resin-encapsulated semiconductor device, comprising:
   a die pad portion;
   a semiconductor element mounted on the die pad portion;
   a plurality of lead portions disposed opposite to the die pad portion;
   a metal thin wire for connecting a plurality of electrodes of the semiconductor element to the plurality of lead portions; and
   an encapsulating resin for encapsulating the die pad portion, the semiconductor element, and the plurality of lead portions so that the plurality of lead portions are partially exposed,
   the plurality of lead portions each including a lead bottom surface part as a bottom surface, a lead outer surface part as a distal end, and a lead upper end part as a part of an upper surface, all of which are exposed from the encapsulating resin,
   the lead bottom surface part being flush with a bottom surface of the encapsulating resin,
   the lead bottom surface part and the lead upper end part each including a plated layer, the encapsulating resin being present above the lead upper end part in a vertical direction via a gap portion provided under the encapsulating resin.

2. A resin-encapsulated semiconductor device according to claim 1, wherein the lead upper end part including the plated layer is formed to have an arc shape in cross section.

3. A resin-encapsulated semiconductor device according to claim 1, wherein the plated layer of the lead bottom surface part and the plated layer of the lead upper end part are formed of one of a single metal layer and an alloy layer of at least two metal layers selected from the group consisting of lead, bismuth, tin, copper, silver, palladium, and gold.

4. A resin-encapsulated semiconductor device according to claim 1, wherein the plurality of lead portions are formed to be thinner as being closer to the lead outer surface part under the encapsulating resin.

5. A resin-encapsulated semiconductor device according to claim 1, wherein the die pad portion has a bottom surface part which is exposed from the encapsulating resin.

6. A resin-encapsulated semiconductor device according to claim 1, wherein the lead outer surface part protrudes outward from a side surface of the encapsulating resin.

* * * * *